United States Patent [19]

Breton

[11] Patent Number: 4,742,302
[45] Date of Patent: May 3, 1988

[54] NUCLEAR MAGNETIC RESONANCE IMAGING INSTALLATION

[75] Inventor: Eric Breton, Voisins les Bretonneaux, France

[73] Assignee: Thomson-CGR, Paris, France

[21] Appl. No.: 774,732

[22] Filed: Sep. 11, 1985

[30] Foreign Application Priority Data

Sep. 14, 1984 [FR] France ................................ 84 14152

[51] Int. Cl.⁴ ............................................. G01R 33/20
[52] U.S. Cl. ..................................... 324/309; 324/307
[58] Field of Search ............... 324/300, 307, 309, 314, 324/310, 312

[56] References Cited

U.S. PATENT DOCUMENTS 4,307,344 12/1981 Walters ................................ 324/309

Primary Examiner—Michael J. Tokar
Attorney, Agent, or Firm—Oblon, Fisher, Spivak, McClelland & Maier

[57] ABSTRACT

In order to generate a radiofrequency excitation signal in an installation for NMR imaging, the envelope of the radiofrequency pulse is deduced from the shape of the selected cross-section which would result from application of a radiofrequency pulse having an envelope representing the desired selected cross-section shape.

8 Claims, 1 Drawing Sheet

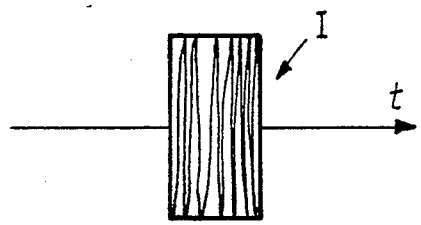
FIG_1-a
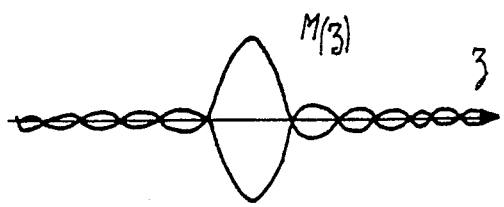
FIG_1-b
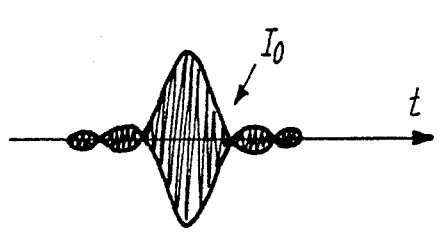
FIG_1-c
FIG_1-d
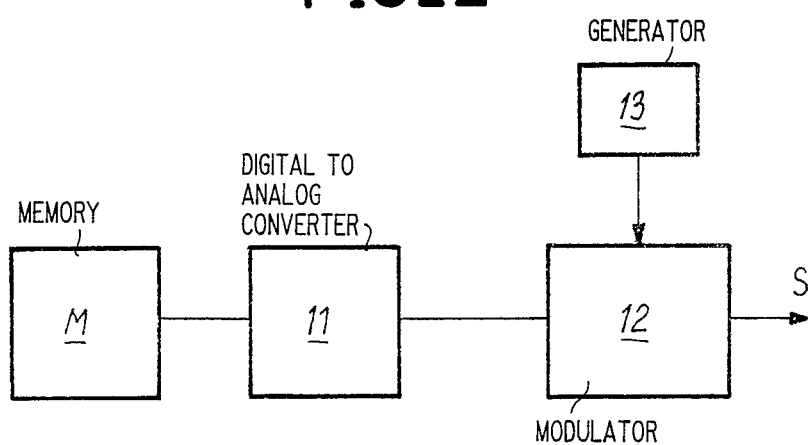
FIG_2

NUCLEAR MAGNETIC RESONANCE IMAGING INSTALLATION

BACKGROUND OF THE INVENTION

1. Field of the Invention

The invention relates to an installation for producing imagery by nuclear magnetic resonance (NMR) and relates more particularly to wave-shaping of the excitation radiofrequency signal in order to obtain a selected cross-section having the desired characteristics, especially a so-called cross-sectional plane (namely a "flat slice" of predetermined thickness of the body to be examined) having limits in space which are as accurate and sharply defined as possible.

2. Description of the Prior Art

A conventional nuclear magnetic resonance (NMR) imaging installation comprises a magnet for producing a uniform magnetic field in a spatial region in which the body to be examined is placed and means for superimposing on said uniform field a field gradient which is oriented in a chosen direction in space, the characteristics of the gradient being modified during successive sequences of data acquisition. Radiofrequency emission means are provided for producing in said spatial region a rotating field which is capable of initiating spin flip in the case of certain nuclei (mostly hydrogen atoms) of the body to be examined. The conditions of nuclear magnetic resonance in which spin flip can be observed are determined by the local value of the magnetic field and the frequency of the excitation electromagnetic wave. In the case of hydrogen, for example, all the conditions of resonance are satisfied for a radiofrequency emission at 6.4 MHz and a magnetic field of 1500 Gauss or for a radiofrequency emission of 64 MHz and a magnetic field of 15000 Gauss.

The superposition of the constant magnetic field and of a gradient in the aforementioned spatial region limits the conditions of resonance to a thin cross-sectional plane or in other words to a selected cross-section of the body to be imaged, with the result that the spins of the nuclei of this cross-section which are being studied are the only ones to flip and consequently the only ones subsequently to re-emit a measurable radiofrequency signal. By carrying out a large number of emission-reception sequences, the set of data thus collected is sufficiently large to reconstruct the image of the cross-section. In order to ensure that the image is of good quality, a useful attempt can be made to obtain a cross-section having boundaries which are as sharp as possible. This entails the need to utilize emission-reception sequences such that the atoms located in the vicinity of the body-section plane whose reconstructed image is to be obtained are not excited or at most only weakly excited in order to ensure that they make the smallest possible contribution to the re-emitted radiofrequency signal. In actual fact, the "shape" of the selected cross-section varies as a function of the envelope of the radiofrequency signal which produces flip-over of spins.

It has always been assumed up to the present time that the "shape" of the selected cross-section (which can be defined as the density of excited spins along an axis perpendicular to the cross-sectional plane) was the Fourier transform of the "shape" of the radiofrequency excitation pulse or in other words the envelope waveform of this signal. This assumption has dictated the choice of an envelope of cardinal-sine shape, where the cardinal-sine of $$x = \text{sinc}(x) = \frac{\sin \pi x}{\pi x}$$

represents the inverse Fourier transform of a rectangular wave. A rectangular wave having vertical sides (leading and trailing edges) is in fact the image of an optimum transition between the selected cross-sectional plane and the rest of the spatial region in which the magnetic field prevails. However, the results have in fact proved disappointing and the shape of the selected cross-section obtained with a radiofrequency pulse of the cardinal-sine type is not fully satisfactory.

SUMMARY OF THE INVENTION

The invention is based on the observation that the shape of the selected cross-section is not exactly the Fourier transform of the radiofrequency pulse shape and on the assumption that the transform f which determines the shape of the selected cross-section from the radiofrequency pulse shape is nevertheless involutory inasmuch as $f^{-1} = f$.

This assumption having been verified by practical experience, it has become possible to redefine a shape of selected cross-section as follows:

identification (by measurement or by computation) of the shape of the selected cross-section resulting from the application, during an emission-reception sequence, of an excitation radiofrequency pulse whose envelope is representative of the cross-section to be selected;

utilization of this selected cross-section shape or a shape deduced from this latter as an envelope for the radiofrequency signal in the emission-reception sequences which serve to group together all the data required for reconstruction of the image of at least one cross-sectional plane.

In the case of certain simple shapes of radiofrequency pulse envelope, identification of the selected-section shape can be effected by computation, especially by means of a program representing the operation of the imaging installation. In all cases, identification can be carried out by measurement in accordance with a procedure which will be indicated hereinafter.

With this objective in mind, the invention is also concerned with an installation for imaging by nuclear magnetic resonance, comprising means for producing a substantially uniform magnetic field in a spatial region, means whereby field gradients having different selected characteristics are superimposed on said magnetic field during successive sequences of data acquisition and radiofrequency emission means for emitting at least one radiofrequency pulse during each sequence. The distinctive feature of the invention lies in the fact that it comprises modulating means for providing said radiofrequency pulse with an envelope deduced from the selected-section shape which would result from application of a radiofrequency pulse having an envelope representing the shape of the desired selected-section shape.

In practice, the shape of the desired cross-section is that of a rectangular wave in the majority of cases since it is sought to produce flip-over of the spins of hydrogen nuclei located in a thin "slice" or cross-sectional plane of the body to be examined while subjecting those nuclei which are located on each side to minimum excitation. In consequence, the envelope of the radiofrequency pulse which is representative of the shape of the desired cross-section as defined above is a rectangular wave. And for this relatively simple type of pulse, it is possible to compute the resultant shape of the selected cross-section. This method of computation is set forth in detail in an article published in 1979 in the "Journal of Magnetic Resonance", volume No. 33. The description of this method deals with two types of radiofrequency rectangular-wave pulse, one type being calibrated for flip-over of spins through 90° and the other type being calibrated for flip-over of spins through 180°. It is in fact known that, in data acquisition sequences involving the phenomenon of spin echo, it is necessary during one and the same acquisition sequence to apply successively a calibrated excitation pulse for a 90° spin flip followed by a calibrated excitation pulse for a 180° spin flip. The results can be improved even further by deducing the radiofrequency pulse envelope from the selected cross-section shape identified in the manner which has been indicated in the foregoing. It has thus proved advantageous to multiply the envelope shape by a Gaussian constant and/or to limit the time-duration of the radiofrequency signal, that is, to truncate said envelope on each side of its maximum amplitude.

Particularly satisfactory results have thus been obtained by employing an envelope F(t) for the radiofrequency pulse of the form:

(1) for producing flip-over of the spins through 90° in the selected cross-section $$F(t) = A_1 \text{ sinc } (B_1 \sqrt{C_1 + X^2}) \exp(-D_1 X^2)$$

X is a reduced variable such that $$X = t - T90/2$$

t being the time interval with $$t \in [0, T90]$$

the envelope is therefore truncated outside this time interval;
T90 represents a time interval such that $$\omega_1 T90 = \pi/2 \quad (1)$$

$\omega_1$ being the rotational velocity of the spins under the action of the useful component of the rotating field produced by the radiofrequency pulse. $A_1$, $B_1$, $C_1$ and $D_1$ are parameters of the function.

(2) In order to cause flip-over of the spins through 180° in the selected cross-section $$F(t) = -A_2 \frac{\cos B_2 \sqrt{C_2 + X^2}}{B_2^2 (C_2 + X^2)} \exp(-D_2 X^2)$$

with
$X = t - T180/2$ and
$t \in [0, T180]$
$A_2$, $B_2$, $C_2$ and $D_2$ are constant parameters of the function and
T180 is a time interval such that $$\omega_1 T180 = \pi \quad (2)$$

In practice, T90 and T180 are selected values and the parameters $A_1$, $A_2$ (related to $\omega_1$ by a relation of proportionality) are so adjusted as to satisfy the relations (1) and (2) respectively.

In respect of a given embodiment, the following parameters have been chosen:

| | |
|---|---|
| $B_1$ = 1.088 | $B_2$ = 8.579 |
| $C_1$ = 0.2320 | $C_2$ = 0.134 |
| $D_1$ = 0.578 | $D_2$ = 0.470 |
| $T_{90}$ = 3.4 ms | $T_{180}$ = 2.7 ms |

$A_1$ and $A_2$ are amplitude factors which depend in particular on the body to be examined; they are therefore adjusted each time.

BRIEF DESCRIPTION OF THE DRAWINGS

Other features of the invention will be more apparent upon consideration of the following description and accompanying drawings, wherein:

FIGS. 1a to 1d are graphs which summarize the procedure involved in determination of the radiofrequency signal envelope as described in the foregoing;

FIG. 2 is a block diagram showing part of the imaging installation in accordance with the invention and illustrating the means for generating a radiofrequency signal having a predetermined envelope.

DETAILED DESCRIPTION OF THE INVENTION

FIG. 1a, the reference I designates the shape of the envelope of an excitation radiofrequency pulse which is representative of the shape of the cross-section to be selected. In consequence, the shape I is that of a rectangular wave within which the radiofrequency signal is "inscribed". If the above-mentioned methods of computation are not adopted for identifying the shape of the selected cross-section resulting from the use of the rectangular wave I, it will be possible to make use of the means provided by the nuclear magnetic resonance (NMR) imaging installation for restituting a signal which is representative of the selected cross-section obtained by the pulse I. To this end, it is only necessary to adopt a test sequence during which the pulse I (as shown in FIG. 1a) is generated in the presence of a selection gradient applied along an axis (Oz, for example) in order to select a cross-sectional plane at right angles to said axis. The sequence is continued by reversing the gradient and by maintaining it throughout the period of reception of the signal emitted as feedback. This signal is sampled and applied to the input of a Fourier transformer. The visual display of this Fourier transform represents the shape of the selected cross-section M(z) (as shown in FIG. 1b). In view of the fact that the transformation is involutory, M(z) can be employed for deducing an envelope shape of the radiofrequency signal having a time-duration which is not too long. This envelope Io is shown in FIG. 1c. The shape of said envelope is derived from that of FIG. 1b by multiplication by a Gaussian constant and truncation. The use of this shape as an envelope of the radiofrequency signal provides a shape of selected cross-section Mo(z) as shown in FIG. 1d. The same procedure can be employed for checking a posteriori the shape of the selected cross-section in response to a radiofrequency pulse having a selected envelope.

Referring now to FIG. 2, the installation comprises a digital memory M which contains the curve of FIG. 1c point by point. Sampling of 200 points with a resolution of 9 bits (plus the sign) in intensity produces satisfactory results. This memory is read at each emission of a radiofrequency pulse. The digital data which are representative of the envelope shape are addressed to the input of a digital-to-analog converter 11, the output of which is connected to a modulation input of a modulator 12. This latter receives the radiofrequency signal emitted by a generator 13 and the output S of the modulator is connected to the antennas of the imaging system by nuclear magnetic resonance via a suitable amplifying chain.

Although the invention described in the foregoing refers to a desired cross-sectional shape which is as close as possible to a rectangular wave (and which corresponds to current requirements of manufacturers), it is clear that the invention is also concerned with the generation of a radiofrequency signal which results in a different shape of selected cross-section. The methodology is applicable in all cases, especially by means of the test procedure described in the foregoing and permits experimental identification of the selected cross-section shape obtained in respect of any radiofrequency signal envelope.

What is claimed is:

1. An installation for imaging by nuclear magnetic resonance (NMR) comprising means for generating a substantially uniform magnetic field in a spatial region, means whereby field gradients having different selected characteristics are superimposed on said magnetic field during successive sequences of data acquisition and radiofrequency emission means for emitting at least one radiofrequency pulse during each sequence, wherein said installation comprises modulating means for providing said radiofrequency pulse with an envelope deduced from the selected-section shape which would result from application of a radiofrequency pulse having an envelope representing the shape of the desired selected-section shape.

2. An installation according to claim 1, wherein said envelope has been deduced from the selected-section shape which would result from application of a radiofrequency pulse having an envelope representing the desired selected-section shape by multiplying said envelope by a Gaussian constant and/or by truncating said envelope symmetrically on each side of its maximum amplitude.

3. An installation according to claim 1, wherein said envelope of a calibrated radiofrequency signal for causing flip-over of the spins through 90° is of the form:

$$F(t) = A_1 \operatorname{sinc}(B_1 \sqrt{C_1 + X^2}) \exp(-D_1 X^2)$$

with $X = t - T90/2$ and $t \in [0, T90]$ $A_1$, $B_1$, $C_1$, $D_1$ and $T90$ being predetermined parameters.

4. An installation according to claim 1, wherein said envelope of a calibrated radiofrequency signal for causing flip-over of spins through 180° is of the form:

$$F(t) = -A_2 \frac{\cos B_2 \sqrt{C_2 + X^2}}{B_2^2 (C_2 + X^2)} \exp(-D_2 X^2)$$

with $X = T - T180/2$ and $t \in [0, T180]$ $A_2$, $B_2$, $C_2$, $D_2$ and $T180$ being predetermined parameters.

5. A method of determination of the shape of the envelope of a radio frequency pulse signal to be employed in an installation for imaging by nuclear magnetic resonance, comprising the steps of:
    choosing an initial envelope shape for a radio frequency signal, said envelope shape corresponding to a first selected section shape;
    applying said initially shaped radio frequency signal to a body subjected to an imaging experiment with said installation; p1 measuring the excitation of said body subjected to said applied signal to obtain a thus second selected section shape;
    extracting from said second selected section shape an extracted envelope shape for said radio frequency signal;
    applying said extracted envelope shaped radio frequency signal in order to obtain said first selected-section shape.

6. A method according to claim 5, wherein the selected-section shape is determined by measurement by means of the installation for imaging by nuclear magnetic resonance.

7. A method according to claim 5, wherein the shape (FIG. 1b) of the selected section is determined by computation.

8. A method according to claim 5, wherein the extracted envelope of the radiofrequency pulse is deduced from the selected-section shape determined by application of the first radiofrequency pulse by multiplication by a Gaussian constant and/or by symmetrical truncation on each side of the maximum amplitude.

* * * * *